US011867730B2

(12) United States Patent
Suchy et al.

(10) Patent No.: US 11,867,730 B2
(45) Date of Patent: Jan. 9, 2024

(54) ADJUSTABLE LOW CURRENT IN A SENSOR NETWORK

(71) Applicant: SEMICONDUCTOR COMPONENTS INDUSTRIES, LLC, Phoenix, AZ (US)

(72) Inventors: Tomas Suchy, Brno (CZ); Miroslav Stepan, Orechov (CZ); Pavel Hartl, Brno (CZ); Marek Hustava, Bratislava (SK); Petr Kamenicky, Brno (CZ)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 75 days.

(21) Appl. No.: 17/176,926

(22) Filed: Feb. 16, 2021

(65) Prior Publication Data
US 2022/0026472 A1  Jan. 27, 2022

Related U.S. Application Data

(60) Provisional application No. 63/057,005, filed on Jul. 27, 2020.

(51) Int. Cl.
*G01R 19/00* (2006.01)
*H03K 5/08* (2006.01)
(Continued)

(52) U.S. Cl.
CPC ....... *G01R 19/0092* (2013.01); *G06F 1/3212* (2013.01); *G06F 1/3215* (2013.01);
(Continued)

(58) Field of Classification Search
CPC . G01R 19/0092; G06F 1/3212; G06F 1/3215; G06F 1/3253; G06F 1/3287; H03K 17/0828; H04L 12/10; H04L 12/40
See application file for complete search history.

(56) References Cited

U.S. PATENT DOCUMENTS 5,861,738 A * 1/1999 Becker-Irvin ........ H02H 7/1213
363/56.12
7,310,211 B2  12/2007 Gruber et al.
(Continued)

FOREIGN PATENT DOCUMENTS

WO   2009011898      1/2009
WO   2019120394 A1   6/2019

OTHER PUBLICATIONS

Denso Corporation, Freescale Semiconductor Inc. and TRW Automotive Inc., "DSI3 Bust Standard," Revision 1.00, Feb. 16, 2011, 45 pages.

*Primary Examiner* — Dominic E Hawkins
(74) *Attorney, Agent, or Firm* — Ramey LLP

(57) ABSTRACT

A sensor device coupled to a communication interface bus, the sensor device includes: a current source having a first terminal operable to receive a supply current, a second terminal operable to provide a supply current, and a control terminal, wherein an operating voltage is supplied by a current through the current source; a voltage clamp having a first terminal coupled to the second terminal of the current source, a second terminal coupled to a power supply terminal, and an output terminal operable to provide a current sense signal; and a control circuit having an input terminal coupled to the output terminal of the voltage clamp and an output terminal coupled to the control terminal of the current source operable to provide an adjustment signal responsive to the current sense signal, wherein the current source is configured to adjust the current through the current source responsive to the adjustment signal.

17 Claims, 7 Drawing Sheets

(51) Int. Cl.
  *H03K 17/082*  (2006.01)
  *G06F 1/3212*  (2019.01)
  *G06F 1/3215*  (2019.01)
  *G06F 1/3234*  (2019.01)
  *G06F 1/3287*  (2019.01)
(52) U.S. Cl.
  CPC .......... *G06F 1/3253* (2013.01); *G06F 1/3287* (2013.01); *H03K 5/08* (2013.01); *H03K 17/0828* (2013.01)

(56) References Cited

U.S. PATENT DOCUMENTS

| | | | |
|---|---|---|---|
| 9,136,766 B2* | 9/2015 | Tang | H02M 3/33523 |
| 9,927,474 B1* | 3/2018 | Bierer | G01R 31/58 |
| 2002/0181180 A1* | 12/2002 | Ivanov | H03F 1/523 |
| | | | 361/57 |
| 2009/0187781 A1 | 7/2009 | Gronemeier et al. | |
| 2013/0021702 A1* | 1/2013 | Waltman | H02M 3/156 |
| | | | 361/91.1 |
| 2020/0106260 A1* | 4/2020 | Telefus | H02H 3/10 |

\* cited by examiner

ADJUSTABLE LOW CURRENT IN A SENSOR NETWORK

CROSS-REFERENCE TO RELATED APPLICATIONS

The present application claims priority benefit of U.S. Provisional Application No. 63/057,005, filed Jul. 27, 2020, entitled "Power Bus with Flexible Constant Current Consumption," which is entirely incorporated by reference herein. The present application is related to U.S. application Ser. No. 17/176,963, filed Feb. 16, 2021, entitled MANAGING POWER DISRUPTIONS IN A SENSOR NETWORK, which is entirely incorporated by reference herein.

BACKGROUND

Distributed system interfaces exist which use power bus communication interfaces connected in a 2-wire configuration to one or more drone devices. In some distributed system interfaces such as these, however, charging and recharging of drone node CTANK capacitors can cause undesirable current peaks. Attempts to address undesired current peaks associated with drone node CTANK capacitors have not been wholly satisfactory. Thus, there is room for improvement in the art.

SUMMARY

Accordingly, there are disclosed herein systems and methods for providing a power bus with flexible constant current consumption.

One illustrative embodiment of this disclosure is a sensor device (104) coupled to a communication interface bus (214), the sensor device (104) comprising: a current source (352) having a first terminal (350) operable to receive a supply current (351), a second terminal (358) operable to provide a supply current (382), and a control terminal (374), wherein an operating voltage (VDD) is supplied by a current (353) through the current source (352); a voltage clamp (301) with a current sensor having a first terminal (360) coupled to the second terminal (358) of the current source (352), a second terminal (366) coupled to a power supply terminal (ground), and an output terminal (368) operable to provide a current sense signal (369); and a control circuit (303) having an input terminal (370) coupled to the output terminal (368) of the voltage clamp (301) and an output terminal (372) coupled to the control terminal (374) of the current source (352) operable to provide an adjustment signal (388) responsive to the current sense signal (369), wherein the current source (352) is configured to adjust the current (353) through the current source (352) responsive to the adjustment signal (388). The voltage clamp (301) can regulate the operating voltage (VDD) regardless of the current flowing between the first terminal (360) and the second terminal (366); the voltage clamp (301) thus creates a stable voltage domain. The voltage clamp (301), along with the control circuit (303) and the current source (352) form a regulation loop for the supply current (351). When the regulation loop is settled, an adjustable portion of the supply current (351) flows through the voltage clamp (301).

Another illustrative embodiment of this disclosure is a sensor node (104) coupled to a communication interface bus, the sensor node (104) comprising: a receiver circuit (404) having a terminal 416 operable to receive a first supply current (435) and a control input (409); a supply circuit (406) having a first terminal (434) operable to receive a second supply current (437), a second terminal (468) coupled to a power supply terminal (ground), a control input (413), and an output (439) operable to provide an operating voltage (VDD); and a control circuit (498) having an input (496) coupled to the output (439) of the supply circuit (406), an output (407) coupled to the control input (409) of the receiver circuit (404) operable to provide a first control signal (441), and a second output (411) coupled to the control input (413) of the supply circuit (406) operable to provide a second control signal (443); wherein the first control signal (441) enables the receiver circuit (404) when the control circuit (498) is operating in a first mode and disables the receiver circuit (404) when the control circuit (498) is operating in a second mode; and wherein the supply circuit 406 is configured to adjust a voltage at output (439) in response to the second control signal (443).

DETAILED DESCRIPTION

The drawings and corresponding detailed description are provided for explanatory purposes, not to limit the disclosure. To the contrary, the drawings and corresponding detailed description provide the foundation for understanding all modifications, equivalents, and alternatives falling within the scope of the appended claims.

One or more embodiments of this disclosure pertain to power bus communications interfaces. Implementations of power bus communication interfaces may use a distributed system interface, such as a two wire third generation, extended class distributed system interface (DSI3XC). Some implementations of DSI3XC communication interfaces may include a DSI3XC node connected with three wires, where the third wire is a dedicated extra DSI3XC communication wire. These DSI3XC power devices may belong to a DSI3XC signal class. Implementations of DSI3XC communication structures may include a DSI3XC drone connected with two wires. In two wire implementations, the extra current used for sensor (drone) power operations is delivered during a power phase; outside of the power phase the drone device is supplied from a locally mounted CTANK capacitor. In some embodiments, the DSI3XC power phase is used to supply the drone device, or devices, with the desired current of power operations and to charge/re-charge the CTANK capacitor. The CTANK capacitor may be charged to a voltage greater than a low power mode voltage threshold to supply the drone device until the next power phase. In some embodiments, a method of charging/recharging the sensor (drone) node CTANK capacitors is implemented which minimizes current peaks that might otherwise negatively effect on-chip power dissipation. In some embodiments, a sensor (drone) node is supplied continuously from a DSI3XC current source or other power class device. This way, loss of charge from the CTANK capacitor(s) during communication phases is minimized. During power phases, only a small amount of charge is required to replenish the CTANK capacitor(s). At least one technical advantage of this arrangement is that power dissipation is low.

Figure 1:
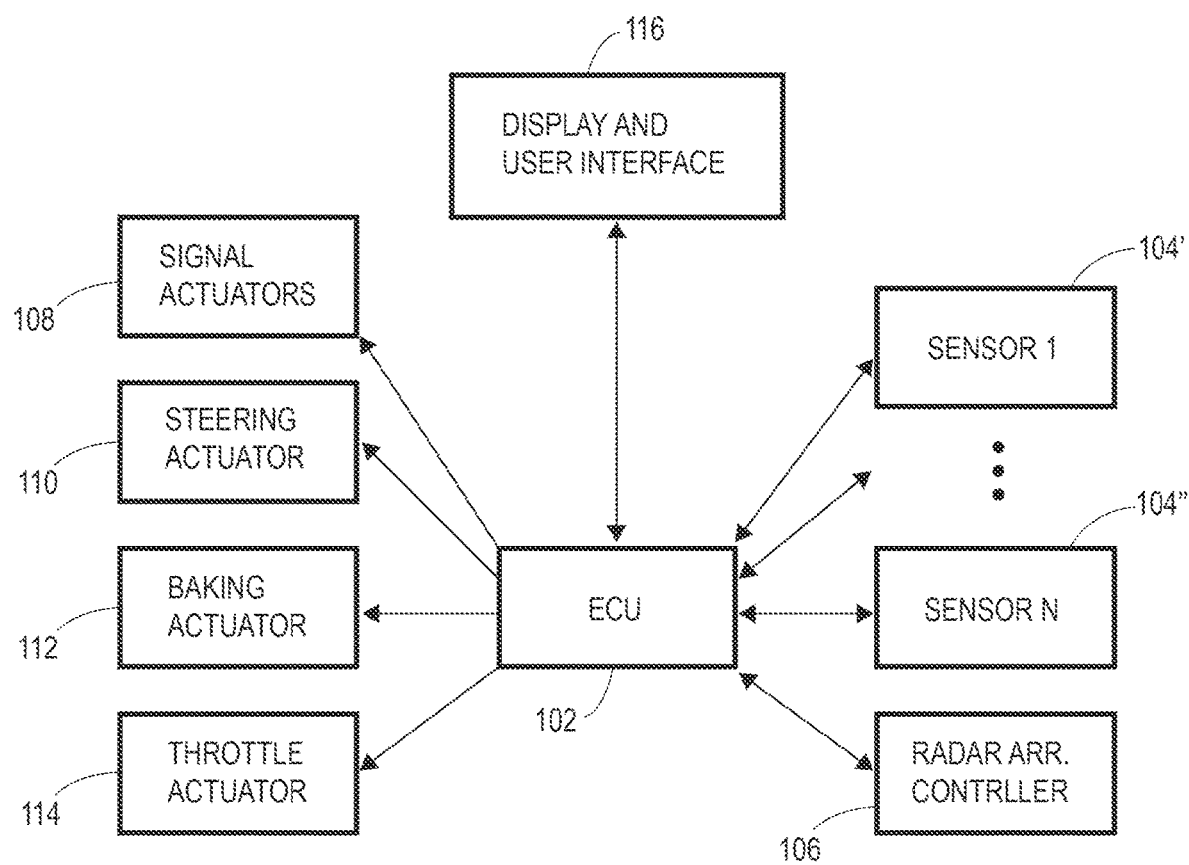
FIG. 1 is a block diagram of a data communication network, in accordance with an example of this disclosure.

FIG. 1 is a block diagram of a data communication network 100, in accordance with an example of this disclosure. FIG. 1 shows an electronic control unit (ECU) 102 coupled to various sensors 104 and a radar array controller 106 as the center of a star topology. In at least some embodiments of this disclosure, the sensors 104 are ultrasonic sensors which generate and receive ultrasonic waves. Of course, other topologies including serial, parallel, and hierarchical (tree) topologies, are also suitable and contemplated for use in accordance with the principles disclosed herein. The radar array controller 106 couples to the transmit and receive antennas in the radar antenna array to transmit electromagnetic waves, receive reflections, and determine a spatial relationship of the vehicle to its surroundings. To provide automated parking, assisted parking, lane-change assistance, obstacle and blind-spot detection, autonomous driving, and other desirable features, the ECU 102 may further connect to a set of actuators such as a turn-signal actuator 108, a steering actuator 110, a braking actuator 112, and throttle actuator 114. ECU 102 may further couple to a user-interactive interface 116 to accept user input and provide a display of the various measurements and system status.

Figure 2:
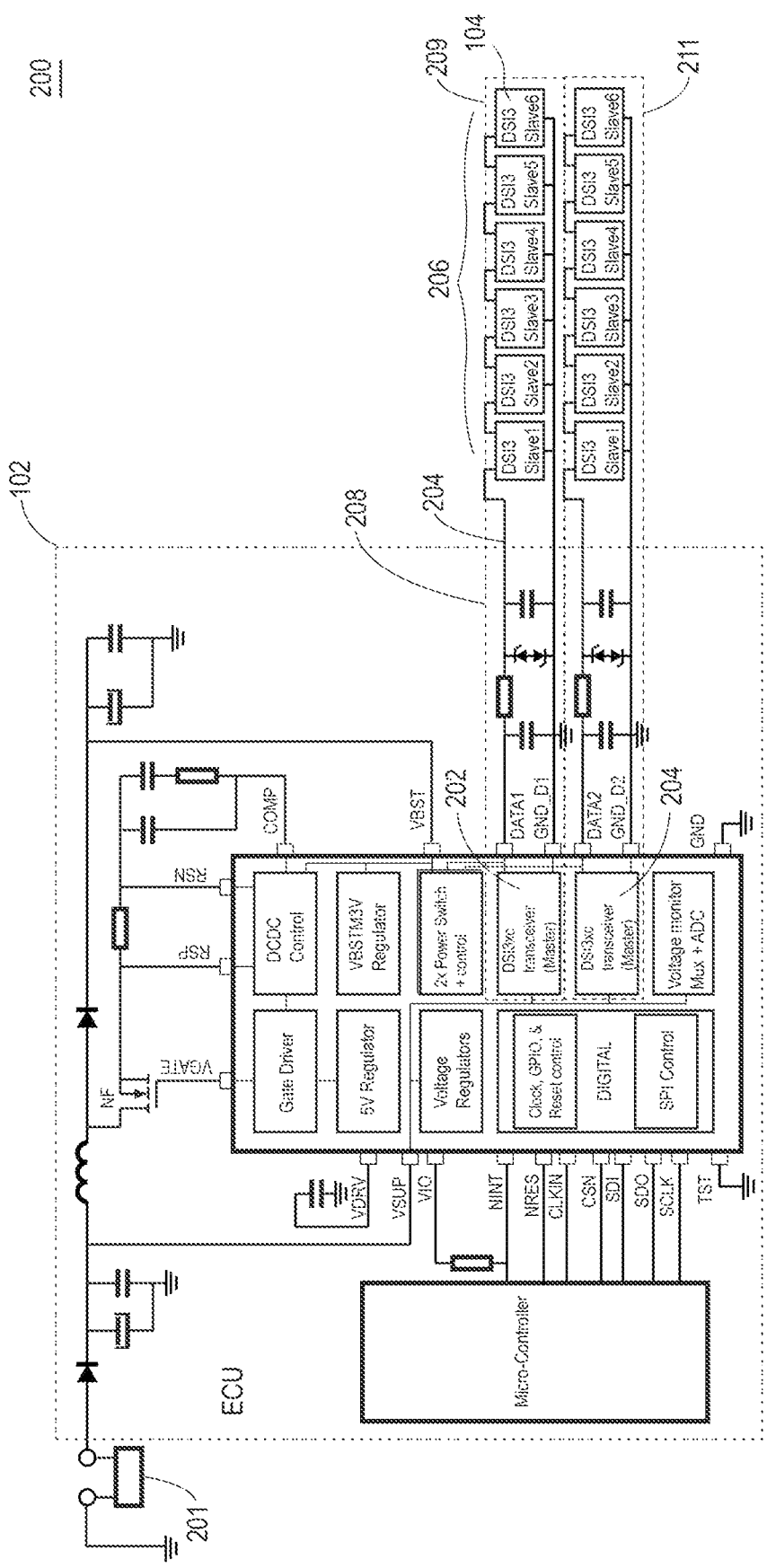
FIG. 2 illustrates a data communication network, in accordance with an example of this disclosure.

FIG. 2 illustrates a data communication network (system) 200 (e.g., 100), in accordance with an example of this disclosure. The data communication network 200 includes an example implementation of a DSI3XC two wire approach using an external (with respect to sensor 104) DC/DC providing supply for a power phase. The system 200 includes an ECU 102 connected to a (car) battery 201 or other suitable constant voltage source. The ECU 102 includes a master (transceiver) 202. The master 202 is coupled to a plurality 206 of sensors (e.g., 104) by a bus structure 208. In at least one example, the bus structure includes a 2-wire connection between the sensors 104 and the master 202. The bus structure 208 includes a bus 214. The bus 214 can be a power bus in a third-generation distributed system interface extended class (DSI3XC) communication wire interface.

The master 202, the plurality 206 of sensors 104, and the bus structure 208 collectively form a sensory network 209. The sensors 104 are connected to the master block 202 in daisy chain fashion. In at least one example of this disclosure, the plurality 206 of sensors of the sensory network 209 are located on or near a bumper of an automotive vehicle, (e.g., a front bumper). As shown, the system 200 can include one or more additional sensory networks 211 operationally similar to sensory network 209.

As will be explained in greater detail, in 2-wire implementations like that illustrated in FIG. 2, drone 104 power operations are at least partially enabled by tank capacitors of the one or more drones 104. These tank capacitors are charged during a power phase of the sensory network 209. In some embodiments, during communications phases, these tank capacitors provide current to the sensors 104. In at least one embodiment of this disclosure, the power and communication phases of the sensory network 209 are interleaved using time divisional multiplexing. drones are supplied by two wires. power and communications phases are interleaved using time multiplexing Embodiments of the present disclosure include at least one sensor node 104 that is partially or fully supplied from the bus 214. In at least one embodiment, the bus 214 is a DSI3XC bus. Embodiments may allow flexible constant current consumption by sensor nodes 104 depending on their operation mode after a power phase of a sensory network (e.g., 209) is partially or wholly finished. Embodiments may implement current consumption tracking by one or more sensor nodes 104 in the sensor node(s) 104 or in a master node (e.g., 202). This current consumption tracking may avoid misinterpretation of current changes at the master node 202 with sensor-to-master communication. Some embodiments may operate sensor nodes 104 with low constant current consumption by nodes 104 outside of the power phase. By operating with low constant current, power efficiency may be improved. Embodiments may reduce duration of the power phase, reduce power phase voltage, reduce power dissipation on the master node 202, and/or lower the cost of application packaging. When the system 200 is part of a park assist system (PAS), performance of the PAS may be improved by shortening the PAS repetition time, and/or may reduce master device 202 cost. PAS nodes 104 may be supplied from the DSI3XC BUS 214 with little or no limitation of maximum duration of a measurement phase and/or communication phase of a sensory network 209 at the sensor nodes 104. In some embodiments, the voltage of a DSI3XC bus 214 follow the battery voltage (VBAT) of the system 200, which may reduce power dissipation at the master node 202.

Figure 3:
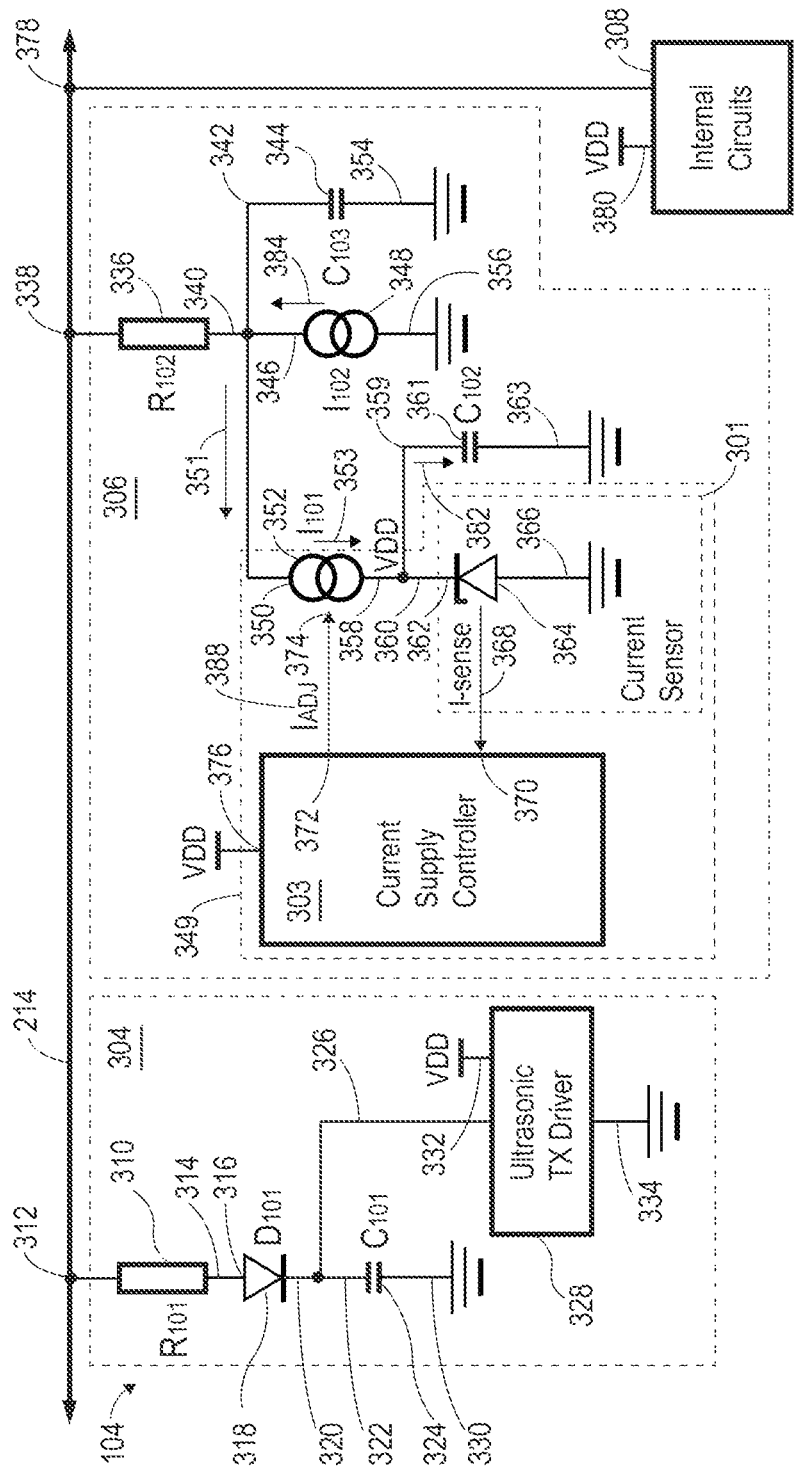
FIG. 3 illustrates a sensor connected to a bus, in accordance with an example of this disclosure.

FIG. 3 illustrates a sensor (drone) 104 (e.g., 104) connected to a bus 214 (e.g., 214), in accordance with an example of this disclosure. FIG. 3 shows an example embodiment of a drone 104 power structure where the drone node is supplied from the DSI3XC bus.

The example of FIG. 3 includes an ultrasonic transmitting (TX) circuit 304, a drone supply circuit 306, and internal drone circuits 308. Some embodiments of the present disclosure may omit the ultrasonic TX circuit 304 and/or the internal drone circuits 308. In other embodiments, the sensor 104 includes a transmitter circuit 304, a supply circuit 306, and a plurality of internal circuits 308, as shown.

The transmitter circuit 304 includes a first resistor 310 (R-101) whose first terminal 312 is connected to the bus 214 and whose second terminal 314 is connected to a first terminal 316 of a forward biased diode 318 (D-101). The second terminal 320 of the forward biased diode 318 is connected to a first terminal 322 of a first (CTANK) capacitor 324 (C-101) and a first terminal 326 of a transmitter driver circuit 328. In at least one embodiment, the CTANK capacitor 324 is a 100-microfarad capacitor to be used outside of the power phase of a sensory network (e.g., 209) to supply the sensor 104. In some implementations, the CTANK capacitor 324 is discharged from 22 volts down to 6 volts during a receive operation of a communications phase of the sensory network 209. The second terminal 330 of the tank capacitor 324 is connected to ground. The transmitter driver circuit 324 has a second terminal connected to a supply (operating) voltage (VDD) and a third terminal connected 334 to ground.

The supply circuit includes a voltage clamp 301 (with a current sensor) and a control circuit. The supply circuit 306 includes a second resistor 336 (R-102) whose first terminal 338 is connected to the bus 214 and whose second terminal 340 is connected to a first terminal 342 of a second capacitor 344 (C-103), connected to a first terminal 346 of a first current source 348 (I-202), and a first terminal 350 of a second current source 352 (I-101). The current source 352 is configured to receive a supply current 351 from bus 214. Voltage clamp 301 can sink any redundant current resulting from the difference of actual current supply demand and the current delivered by current source 352. Based on the current 388 from controller 303, the current source 352 generates an adjustable current 353 which emanates from terminal 358. The second terminal 354 of the second capacitor 344 and the second terminal 356 of the first current source 348 are connected to ground. The current source 352 is connected at a second terminal 358 to an input 360 of the voltage clamp 301 and connected to a first terminal 359 of a third capacitor 361 (C-102); the third capacitor 361 (C-102) has a second terminal 363 which is connected to ground.

Returning to discussion of the voltage clamp 301, in some embodiments, the input 360 of the voltage clamp 301 corresponds to a first terminal 362 of a voltage regulator 364. In at least one embodiment, the voltage regulator 364 comprises a Zener diode whose cathode terminal (362) is connected to the second terminal 358 of the second current source 352 and whose anode terminal 366 is connected to ground. The voltage clamp 301 includes an output terminal 368 which is connected to an input terminal 370 of the control circuit 303. The control circuit 303 has an output terminal 372 connected to an input terminal 374 of the second current source 352. The control circuit 303 has a third terminal connected to the supply (operating) voltage (VDD).

The plurality of internal circuits 308 is connected at a first terminal 378 to the bus 214 and connected at a second terminal 380 to the supply (operating) voltage.

As noted, the third current source 352 has a second terminal 358 which is connected to capacitor 361 and to the first terminal 360 of a current sensor circuit 301. The current sensor circuit 301 includes a voltage regulator 364 whose first terminal 362 corresponds to the first terminal 360 of the voltage clamp 301 and whose second terminal 366 is connected to ground.

In some embodiments of the present disclosure, the voltage clamp 301 is a shunt current sensor; however, in other embodiments different types of voltage clamps 301 may be used. Current source 352 (I-101) may drive a supply current 382. Current source 348 (I-102) may drive a transmitting current 384. Supply current 382 is also used to charge capacitor 361 (C-102) to the operating voltage VDD. It will be understood by those of skill that operating voltage VDD is the operating voltage for drone 104. In broader sense, supply current 382 supplies all the circuitry connected to VDD. The voltage clamp 301 senses current consumed by the drone 104 and provides a current sense signal 369 (I-Sense) to the control circuit 303. The current supply controller 303 receives signal 369 and provides an adjustment signal labeled 388 (I-ADJ) to adjust the magnitude of supply current 382 provided by current source 352 (I-101). In at least one embodiment, the current supply controller 303 may automatically adjust the magnitude of supply current 382 in response to signal 369 (I-Sense). In at least one embodiment, voltage clamp 301 senses the difference of actual drone current supply demand represented by supply current 382 and the current delivered by current source 352. This difference is compared with the target level, and based on the result, the correction signal 369 is generated. As noted, voltage clamp 301, current source 352, and controller 303 form a regulation loop circuitry controlling the current (e.g., 351) supplying the drone circuit.

The ultrasonic TX circuit 304 may include resistor 310 (R-101), diode labeled 318 (D-101), decoupling CTANK capacitor 324 (C-101), and ultrasonic TX driver 328. The ultrasonic TX driver 328 may be supplied by operating voltage VDD from the drone supply circuit 306.

As noted, the drone 104 may include additional internal drone circuits 308. These circuits 308 may receive information from the DSI3XC bus 214 during a communications phase of the sensory network 209. In some embodiments these circuits 308 may be supplied by operating voltage VDD from the drone supply circuit 306.

The drone device 104 is supplied via local current source 352 (I-101). Current source 352 supplies operating voltage VDD, which is regulated to a given voltage domain, (e.g., 5 volts). Current 382 is distributed amongst various components of the sensor 104 based on need. At least some of this current flows through internal current shunt circuit 301. The flow of excess current is reported to the digital current supply control circuit 303 as signal 386. When excess current flows to the shunt circuit 301, the control circuit 303 emits an adjustment signal 388 which causes current source 352 (I-101) to decrease its current output. The Current source 352, the shunt circuit 301 and the control circuit 303 form a regulation loop 349 which locks the current output by current source 352 to the minimum needed for the drone node 104 to perform properly; the amount of current coming from current source 352 is adjusted according to the actual needs of the supply circuit 306 and/or the drone node 104.

In accordance with one or more embodiments, the rate at which the current 382 from the current source 352 changes is adjusted slowly. By avoiding current peaks, communications across the bus 214 are not impaired.

In at least one example of this disclosure, operational voltage (VDD) corresponds to a low voltage supply and represents a low voltage supply net that supplies power to the circuits of the drone node 104. The 'net' draws current from the master 202 through bus 214 during the power phase and the communications phase and supplies current to various components of the node 104. This arrangement obviates the need for the components to draw excessive current through the bus 214 during the communications phase, which could interfere with communications through the bus 214.

In one or more examples of this disclosure, the amount of current necessary to operate a given component varies during an operational cycle of a sensory network 209. The amount of current drawn from the CTANK capacitor 324 is balance and stabilized by current source 352 (and the regulation loop comprising current source 352). By managing the amount of current drawn from capacitor 324 during the communications phase, the need to substantially replenish the capacitor 324 (e.g., during the power phase) during the power phase is avoided. Furthermore, managing the amount of current drawn from capacitor 324 during the communications phase also means that current to power components of the drone 104 often does not need to be transmitted over the bus 214 during the communications phase, which would undesirably impair the quality of communications between the master 202 and the sensors 104. In some embodiments, there is virtually no current path from bus 214 to CTANK capacitor 324 in the communications phase due to diode 318 insofar as bus 214 has a lower voltage level than CTANK capacitor 324.

Figure 4:
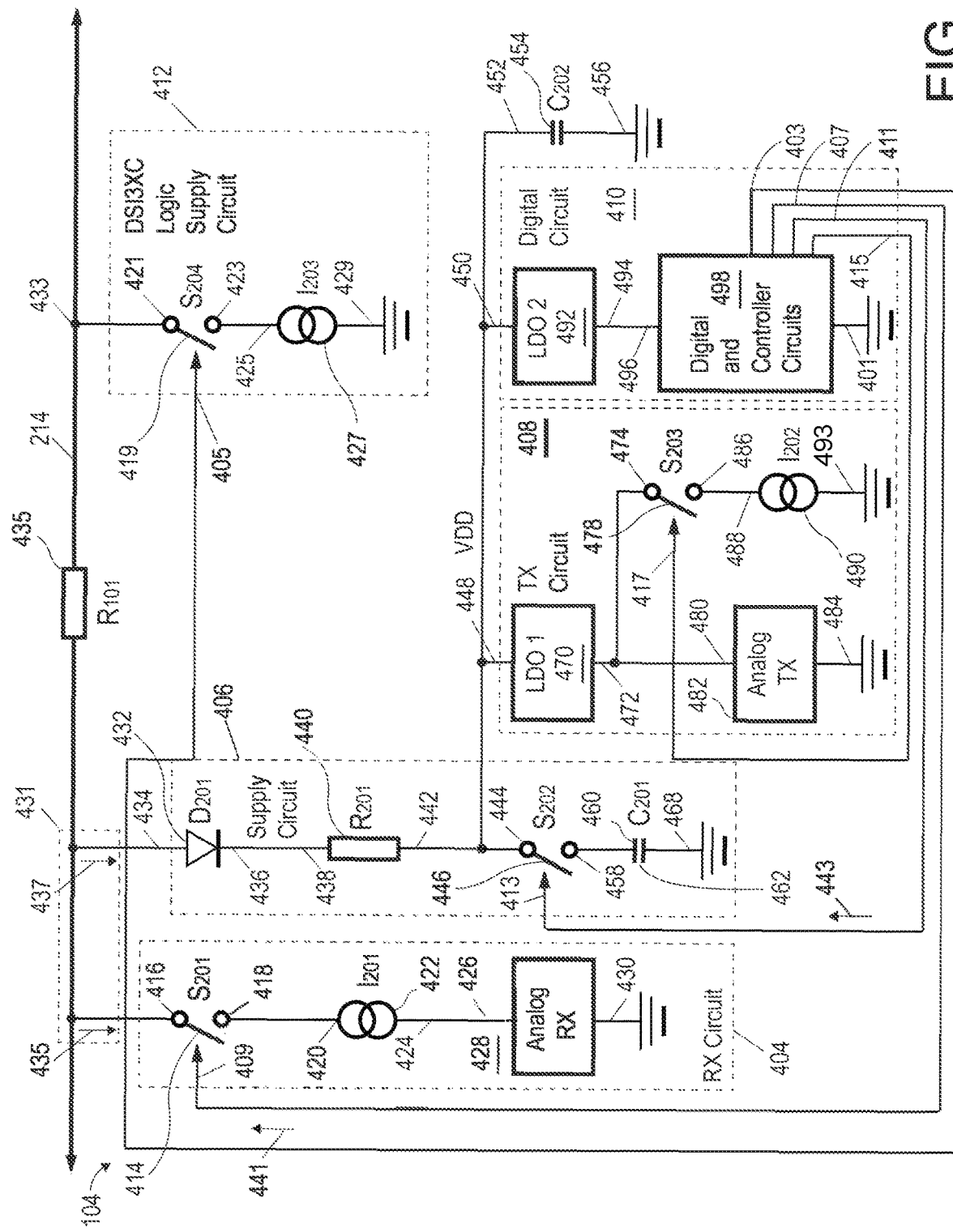
FIG. 4 also illustrates a sensor connected to a bus, in accordance with an example of this disclosure.

FIG. 4 illustrates a sensor 104 (e.g., 104) connected to a bus 214 (e.g., 214), in accordance with an example of this disclosure. The sensor 104 includes a receiver circuit 404, a supply circuit 406, a transmitter circuit 408, a digital circuit 410, and a logic supply circuit 412. In some embodiments, the logic supply circuit 412 comprises DSI3XC circuitry which handles data communication in the communication phases. Circuit 412 sends and receives voltage communication signals. If switch S204 is enabled (by signal 405 from control circuit 498), current communication by circuit 412 is also possible. In some embodiments, circuit 412 is connected to bus 214 at another node 451, which enables circuit 412 to receive voltage communications regardless of whether switch S204 is open.

The receiver circuit 404 includes a switch 414 ((S-201) whose first terminal 416 is connected to the bus 214 and whose second terminal 418 is connected to a first terminal 420 of a current source 422 (I-201). The first terminal 416 can receive a first supply current 435 from bus 214. The second terminal 424 of the current source 422 (I-201) is connected to a first terminal 426 of an analog receiver 428. The second terminal 430 of the analog receiver 428 is connected to ground.

The supply circuit 406 comprises a second forward biased diode 432 (D-201) whose first terminal 434 is connected to the bus 214 and whose second terminal 436 is connected to a first terminal 438 of a third resistor 440 (R-201). Terminal 434 can receive a second operating voltage from bus 214. The second terminal 442 of the third resistor 440 is connected to a first terminal 444 of a second switch 446 (S-202), a first terminal 448 of the transmitter circuit 408 (through output 439), a first terminal 450 of the digital circuit 410, and a first terminal 452 of a second tank capacitor 454 (C-202). The second terminal 456 of the second tank capacitor 454 is connected to ground. The switch 446 of the supply circuit 406 includes a second terminal 458. The second terminal 458 of switch 446 is connected to the first terminal of another tank capacitor 462 (C-201). The second terminal 468 of tank capacitor 462 is connected to ground. When switch 446 is closed, resistor 440 is coupled to tank capacitor 462.

The transmission circuit 408 comprises a 1st low-drop regulator whose first terminal 448 is connected to the second terminal 442 of resistor 440. The second terminal 472 of low-drop regulator 470 is connected to a first terminal 474 of a switch 478 (S-203) and a first terminal 480 of an analog transmitter 482. The second terminal 484 of the analog transmitter 482 is connected to ground. The second terminal 486 of switch 478 is connected to a first terminal 488 of a current source 490 (I-202). The second terminal 493 of current source 490 is connected to ground. When switch 478 is closed, current source 490 is coupled to the second terminal 472 of the first low-drop regulator 470.

The digital circuit 410 comprises a second low drop regulator 492 whose first terminal 450 is connected to the second terminal 442 of resistor 440 and whose second terminal 494 is connected to a first terminal 496 of a control circuit 498. In at least one embodiment, the control circuit 498 comprises one or more digital circuits and controller circuits. The control circuit 498 has a second terminal 401 which is connected to ground. The control circuit 498 has a first output 403 connected to a control input 405 of the logic supply circuit 412. The control circuit 498 has a second output 407 connected to the control input 409 of switch 414 of the receiver circuit 404 through which the control circuit can send control signal 441. The control circuit 498 has a third output 411 connected to a control input 413 of switch 446 of the supply circuit 406 through which it can send a control signal 443 to switch 446. The control circuit 498 and a fourth output 415 connected to the control input 417 of switch 478 of the transmitter circuit 408.

The logic supply circuit 412 comprises a switch 419 (S-204) whose first terminal 421 is connected to the bus 214 and whose second terminal 423 is connected to a first terminal 425 of a current source 427 (I-203). The second terminal 429 of current source 427 of the supply circuit 412 is connected to ground. The first terminal 426 of switch S201 of the receiver circuit 404 and the first terminal 434 of the Zener diode 432 form an input node of the sensor circuit 104. The first terminal 421 of switch 419 of the logic supply circuit 412 forms an output node 433 of the sensor circuit 104. The input node 431 and the output node 433 are separated by a resistor 499 (R-202) on the bus 214. It will be understood by those of skill that the resistor 499 on the bus 214 serves, among other things, to enable addressing of the sensor 104 by the master 202 within a plurality 206 sensors. In at least one example, the output node 433 of a sensor 104 is connected to the input node 431 of another sensor (e.g., 104).

In the embodiment illustrated in FIG. 4, the drone node's receiving (RX) operation is supplied from the DSI3XC bus 214, and the digital and transmitting (TX) operations are supplied from the CTANK capacitor 462 (C-201) and the DSI3XC bus 214.

As noted, the drone circuit 104 includes a receiver (RX) circuit 404, a supply circuit 406, a DSI3XC logic supply circuit 412, a transmitter (TX) circuit 408, a digital circuit 410, and additional capacitor 454 (C-202). The RX circuit 404 includes switch 414 (S-201), current source 422 (I-201), and an Analog RX block 428. The circuits providing the drone node's RX operation are represented by Analog RX block 428. Current source 422 (I-201) is supplied by the DSI3XC bus when switch 414 (S-201) is closed by control circuit 498. When the RX operation is not currently needed switch 414 (S-201) is opened by control circuit 498, disabling the Analog RX block 428 and reducing overall current consumption of the drone node 104.

The circuits providing the drone node's supply circuit 406 include a diode 432 (D-201), resistor 440 (R-201), switch 446 (S-202), and CTANK capacitor 462 (C-201). When switch 446 (S-202) is open, the DSI3XC bus 214 supplies the TX circuit 408 and digital circuit 410. When switch 446 (S-202) is closed, CTANK capacitor 462 may be charged or used as a supply for the TX circuit 408 and the digital circuit 410. In some embodiments, when switch 446 (S-202) is closed by control circuit 498, CTANK capacitor 462 (C-201) supplies the TX circuit 408 and digital circuit 410 in addition to, or in place of the DSI3XC bus 214.

In at least one embodiment, the TX circuit 408 of drone node 104 includes low-dropout (LDO) voltage regulator 470, Analog TX block 482 representing analog circuits providing TX operations, a switch 478 (S-203), and current source 490 (I-202). In some embodiments, LDO 470 is a 3.3-volt LDO voltage regulator, however other voltage ratings may be used. When switch 478 (S-203) is closed, current source 490 (I-202) may provide additional supply current for TX operations. Some embodiments use current source (I-202) to supply TX operations involving ultrasonic front-end functions, such as, but not limited to, ultrasonic beaming.

In one or more embodiments of node 104, additional circuit elements are used to provide DSI3XC logic. As noted, drone circuit 104 includes switch 419 (S-204) and current source 427 (I-203). When switch 419 (S-204) is closed, current source 427 (I-203) supplies current for DSI3XC logic circuits 412. When current source 427 (I-203)

is not needed, switch 419 may be opened, reducing current consumption of drone node 104.

The digital circuit 410 of drone node 104 includes a second LDO voltage regulator 492 and a digital block 498 representing digital circuits for digital operations, e.g., controlling switch 414, switch 446, switch 478, and switch 419. In one at least one example, LDO 492 is a 1.8-volt LDO voltage regulator, however other voltage ratings may be used. Current consumption of node 104 may be reduced by flexibly controlling sources (e.g., 422, 490, 427) for the drone node 104 while conducting TX and/or digital operations.

Embodiments of the present disclosure may provide a PAS drone node (e.g., 104, 104) using DSI3XC two wire communication interface (e.g., 431, 433) powered from the communication line 214 (e.g., 214, 214) or a combination of the communication line 214 and a CTANK capacitor (e.g., 324, 462). Embodiments may adjust the current supplied to the drone node 104 to a constant low value for a given operational mode (e.g., a communication phase). For embodiments supplied from the communication line 214, sensor 104 current consumption may be reduced or controlled using a regulation loop, (see e.g., current source 352, voltage clamp 301 and control circuit 303 of FIG. 3). For embodiments supplied from a combination of the communication line (e.g., 214) and a CTANK capacitor (e.g., 462), sensor 104 current consumption may be reduced or controlled by switching off a constant current source (e.g., 422) once the drone node 104 enters an operational mode where the RX block (e.g., 428) functionality is not currently needed.

In some embodiments, when a drone node 104 is supplied power by the communication line 214 and the CTANK capacitor 462, digital current consumption may be reduced by clock-gating of one or more switches (e.g., switch 414).

Embodiments of the present disclosure may provide improved performance of master 202 and drone 104 communication buses 214. Embodiments may have drone nodes (e.g., 104, 104) operate with flexible constant current consumption outside of the power phase. Moreover, embodiments of the present disclosure may be used in a variety of applications, including for example two-wire bus connections for PAS nodes that use master-to-drone communication.

In at least one example, a sensory network (e.g., 209) has a master-to-drone communication bandwidth of 50 kilobits/second. In at least one example, a sensory network (e.g., 211) has a drone-to-master communication bandwidth of 400 kilobits/second, though other bandwidths are possible. Some embodiments of a drone sensor (e.g., 104) may operate with fewer or more CTANK capacitors (e.g., 462).

There are many technical advantages and benefits associated with embodiments of this disclosure. Some embodiments of this disclosure reduce the amount of power dissipated by one or more master nodes (e.g., 202), allowing for less expensive components to be utilized and/or allowing for simplified integration of a communication network 200 into body control modules (not shown). In some embodiments, the size and/or capacity of one or more capacitors of the ECU 102 external to the CTANK capacitors discussed (e.g., capacitor 462) is smaller than would be the case if the CTANK capacitors (e.g., 324) internal to the drone nodes (e.g., 104) were not present. In at least one embodiment, the duration of the power phase of a sensory network (e.g., 209) is reduced. In at least one embodiment, the voltage supplied to one or more sensors 104 by a master node (e.g., 202) during a power phase is significantly lowered than would otherwise be the case. For example, delivery of 22 volts during a power phase is common in conventional systems, whereas in embodiments of this disclosure, only 12 volts is delivered to sensor nodes (e.g., 104) during the power phase.

Figure 5:
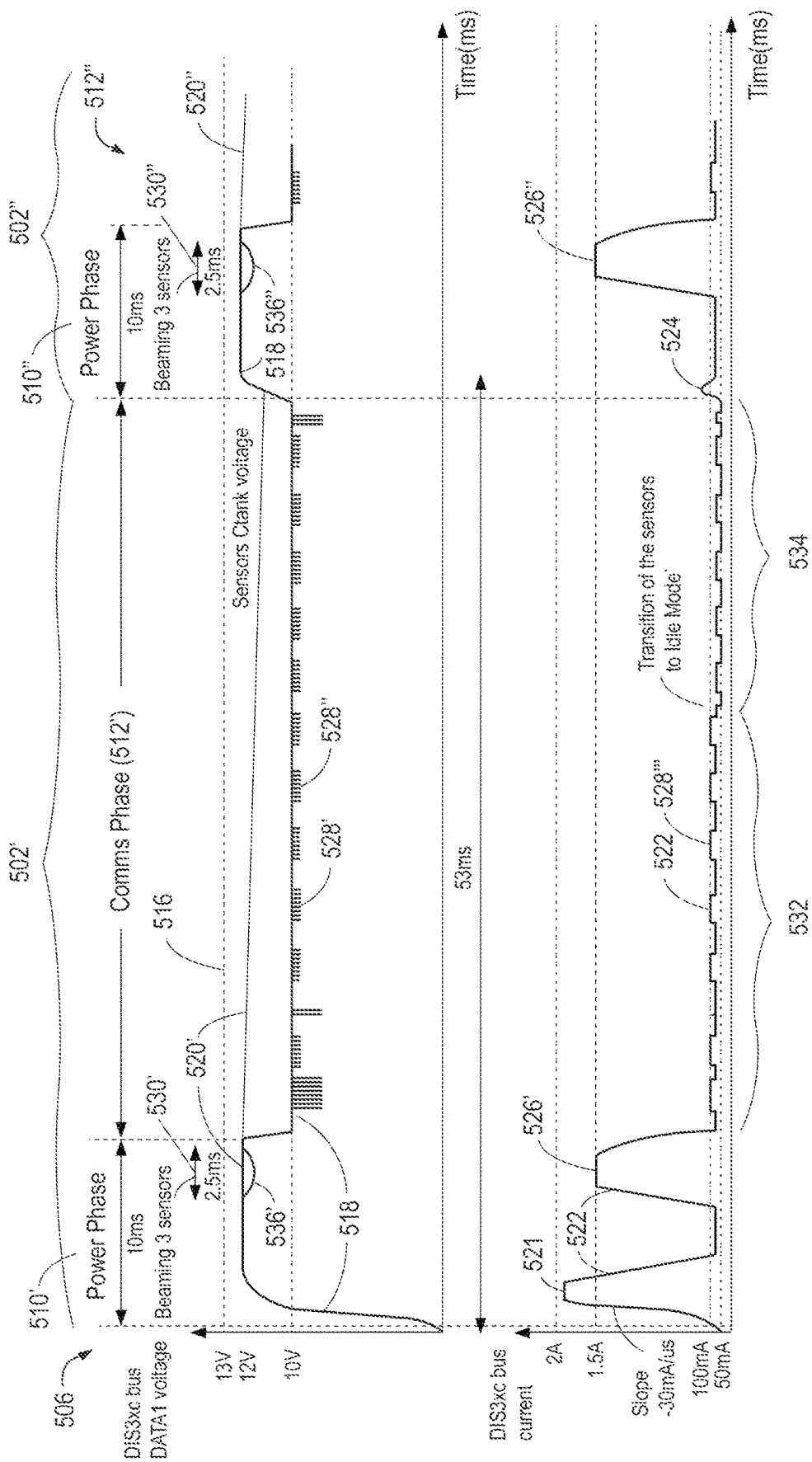
FIG. 5 illustrates a relationship between voltage and current during a first operational cycle and a second operational cycle of a sensory network, in accordance with an example of this disclosure.

FIG. 5 illustrates a relationship between voltage and current during a first operational cycle 502 and a second operational cycle 504 of a sensory network (e.g., 209), in accordance with an example of this disclosure. FIG. 5 shows example current and voltage signals of a DSI3XC bus (e.g., 214) supplying a drone node (e.g., 104, 104). FIG. 5 Includes a voltage versus time graph 506 and the current versus time graph 508. The first plot 506 shows a first operational cycle 502 and a portion a second operational cycle 504. The first operational cycle 502 includes a first power phase and a communications phase 512. Likewise, the second operational cycle 504 includes a second power phase 514 and a communications phase 512. The communications phase 512 of the second operational cycle 504 is shown only in part because the communications phase 512 of the second operational cycle 504 is identical to that of the first cycle 502 in every important respect. The first line 516 in the first plot 506 represents the voltage (VBAT) of a battery or other (substantially) constant voltage source. The second line 518 represents the voltage at the bus (e.g., 214). The third line 520 in plot 506 represents the voltage of the tank capacitor(s) (e.g., 324) of the sensors 104.

Line 522 of plot 508 represents the amount of current across the bus (e.g., 214). During the power phases (e.g., 510, 510), a master node 202 delivers current to one or more nodes 104. As shown in the second graph 508, during the initial power phase 510, the master 202 delivers a large amount (e.g., 2 amps) to raise the voltage of the tank capacitors to their maximum level. Thereafter in the first power phase 510, a second (smaller) spike in current is used to drive the transmitters (e.g., 482) of the sensory network. Driving the transmitters causes the transmitters to emit signals which are reflected by one or more objects. The reflected signals are detected by one or more sensors 104 and detection information is sent from the sensors to the master during the communications phase 512. During the intervals in which the transmitters emit signals (power phase 510, 514), the voltage at the tank capacitor(s) remains substantially constant (at about 12 volts in FIG. 5), as shown in plot 506. In some embodiments, during the communications phase 512, the tank capacitor(s) replenish the sensors; the voltage at that tank capacitors declines at a steady (and gently sloping) rate during the communications phase 512. However, during normal operating conditions, the CTANK does not lose its charge in the communication phase, since supply current is delivered by current source 352, current source 422, and others.

In the second operating cycle 504, the power phase 514 precedes the communications phase, as in the first operating cycle 502. At the end of the first communications phase 512 of plot 506, the voltage across the bus 214 is (approximately) 10 volts. During the second power phase 514, the master node supplies current to the tank capacitors. However, because the tank capacitors were fully charge during the initial power phase (to 12 volts), although they supplied one or more sensors during the communications phase 512, their voltage level is approximately 11 volts at the end of the communications phase and the beginning of the power phase. Consequently, only a brief and low magnitude current increase (peak 524) is necessary to recharge the tank capacitors. As in the first power phase, a second current spike is used to drive the transmitters. In conventional arrangements in which a steep current spike—not unlike the initial spike 521 in the first power phase 510—is required to recharge one or more system capacitors during most or all power phases, embodiments of the current disclosure obviate the need for such recharging. In some embodiments, supplying the drone node 104 in the manner described not only limits current peaks during CTANK capacitor recharging, but also reduces CTANK capacitor current consumption overall.

As discussed, FIG. 5 shows, at least in part, how the master device 202 behaves to manage the power phases 510, 514 and the communication phases 512 of the sensory network 209. During the power phases 510, 514 the voltage level rises to recharge the local charge on CTANK capacitors and to transmit ultrasonic signals (corresponding to peaks 526 in plot 508). As can be seen in FIG. 5, power phases (e.g., 510) of the sensory network 209 are shorter than the communications phases 512. When the power phase 510 is ends, the voltage level 518 on the bus 214 drops and the communication phase 512 occurs. During the communications phase 512 voltage and current communications occur over the bus 214. During the power phase 510, the sensors 104 drag (some or all) current for their (transmit) operations through the bus 214 from the master device 202. Reflection of transmitted signal can occur during both the power phase 510 and the communications phase 512 because transmitting ultrasonic waves closely approximates transmitting acoustic waves in air speed. Since ultrasonic waves travel in the range of 330 meters per second, reflections from obstacles within 1 meter of the transmission are detected in approximately 6 milliseconds. In at least one embodiment of this disclosure, the communications phases 512 are 53 milliseconds in length. During that 53-millisecond interval, reflected ultrasonic waves are detected by one or more sensors 104. Information transferred during the communications phases pertains to real and actual data collected by the sensors 104. Through time division multiplexing, each of the one or more sensors 104 has one or more allocated times 528 to send its data to the master 202. In some examples, the data from the sensors 104 corresponds to an encoded magnitude of a reflected signal.

During brief intervals 530 (e.g., 2.5 millisecond intervals), the sensory network 209 stimulates one or more ultrasonic transducers in the drone nodes 104 and ultrasonic waves are transmitted as a result. In some examples, during a first portion 532 of the communications phase 512, the sensors 104 operate in a measurement mode, and operate in an idle mode during a second portion 534. In at least one example, the relative lengths of the measurement period 532 and the idle period 534 is set by the master 202 during the communication phase 512. The sensors 104 consume less current during the idle period 534 than during the measurement period 532. When the sensors are idle mode the regulation loop (current source 352, voltage clamp 301, control circuit 303) tracks this current consumption and helps to ensure that the amount of current delivered to the sensor 104 is no greater than necessary to ensure the sensor 104 will be fully operational in one or more subsequent operational cycles 502.

In plot 508, the first increase of current (first bump 521) during the power phase 510 corresponds to the charging to the tank capacitor(s). Once the tank capacitor(s) are charged from the high current 521 across the bus 214. The second increase in current consumption 526 corresponds to the beaming of such signals. During the beaming intervals 530, the voltage at the supply resistor 440 can be caused to (temporarily) drop, corresponding to the concave portions 536 of bus voltage 518. During the measurement period 532 of the communications phases, average current consumption by the sensors 104 is greater than during the idle period 534. During the measurement period 532, receivers 404 consume more current than during the idle portion 534. Current consumption by receivers 404 and other components is modulated. Thereafter, when there is no further need to receive ultrasonic signals (e.g., sufficient information regarding obstacles has been collected) so the sensory network 209 can switch to the idle mode 534. During the idle mode, although current consumption is reduced, current is still required to enable the sensors 104 to send measurement data to the master 202.

As noted, the first peak 524 in the second power phase 510 is much smaller than in the first because the first spike 521 was necessary to fully charge the tank capacitor(s) 324. The charge at the tank capacitors(s) 324 does not drop to zero at the end of the first cycle 502, so only a small amount of current is required to return the capacitors to a fully charged level in subsequent power phases 510. During beaming operations 530, the tank capacitor 324 provides supply voltage only to the transmitter 304, 408. Thereafter, only a relatively small amount of current needs to be supplied by the tank capacitor. Moreover, regulating the supply current 382 to the sensors 104 enables the tank capacitor(s) to be charged in part by current received from the master not only during the power phase—but also during the communications phase—without interfering with communications across the bus during the communications phase.

Figure 6:
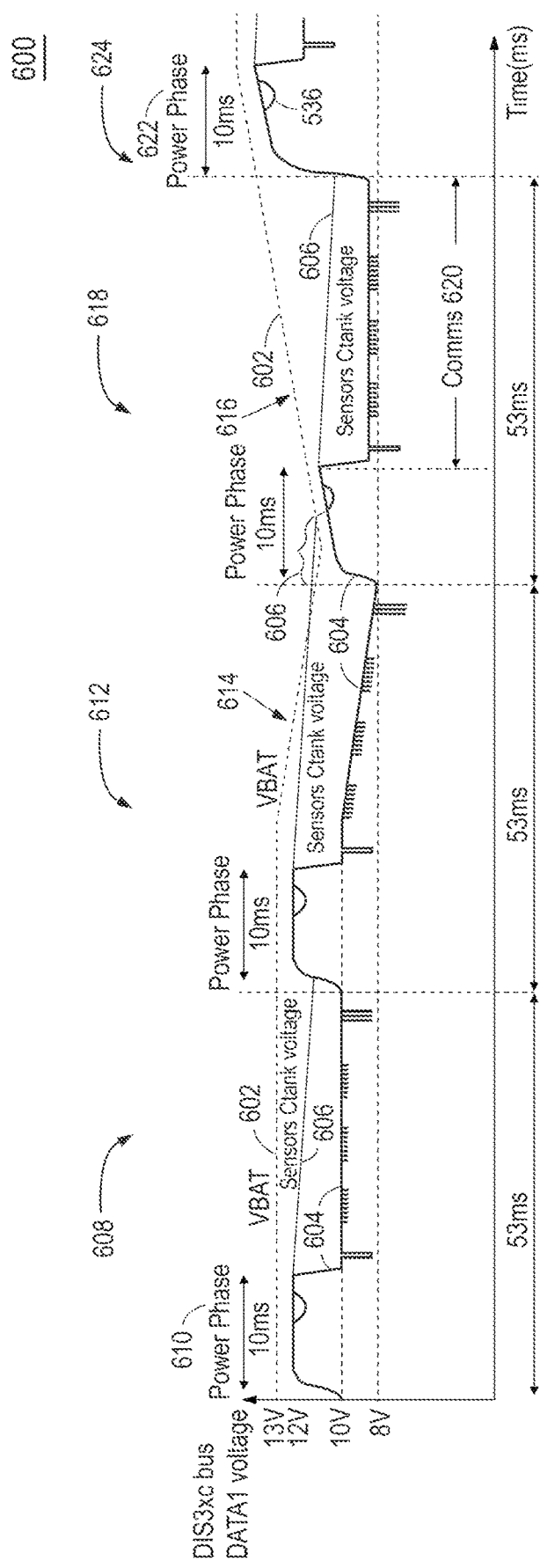
FIG. 6 illustrates a voltage plot of various components operation of a sensory network, in accordance with an example of this disclosure.

FIG. 6 illustrates a plot 600 of voltage conditions during four operational cycles of a sensory network 209, in accordance with an example of this disclosure. A first line 602 represents a battery voltage or other (substantially) constant power source. A second line 604 represents a voltage across bus 214 between a master node 202 and one or more sensors 104 over multiple operational cycles. In at least one example, the bus 214 is a DSI3XC bus that follows the VBAT level 602. In some embodiments, having the bus 214 voltage 604 follow the battery voltage 602 reduces power dissipation at the master device 202. By reducing power dissipation at the master device 202, heat generated by the master device 202 can also be reduced. In the first operational phase 608 of the sensory system 209, the voltage levels of power phase are the same as those in power phase 510 of FIG. 5. As batteries age, sometimes their output voltage drops, at least temporarily. In the second operational phase 612 of the sensory network 209, the battery voltage 602 drops 614. However, when VBAT 602 drops 614, the bus 214 voltage 604 follows VBAT 602, allowing enough voltage room for the master block 202 to deliver current to the sensors 104 to compensate. In some embodiments, when VBAT 602 drops below a threshold, (in this example a threshold of approximately 10.5 volts), a DC-DC booster (not shown) is activated. As a result, the bus 214 voltage 604 remains above a predetermined level, (in this example a voltage level of 8 volts). When VBAT increases 616 in the third operational cycle 618, the bus 214 voltage 604 output is shaped like the voltage output of the first operational cycle 608, albeit at a lower average level. Because the voltage 604 remains stable, CTANK diodes (e.g., 318, 432) of the sensory network 209 are not activated, and the accuracy of communications between the sensors 104 and the master block 202 during the communications phase 620 is unimpaired as a result. (It will be understood that the reverse biasing effect of diode 318 minimizes disruptions in data communications with CTANK capacitor 101 and servers to keep voltage 604 below voltage 606 in phase 618.) A primary reason not to raise voltage 604 is to keep diode 318 closed. Notably, at the end of the second operational cycle 612 and the beginning of the third operational cycle in the embodiment illustrated in FIG. 6, the CTANK capacitor voltage exceeds the battery voltage 602. In some embodiments, power dissipation at the master block 202 may briefly exceed a target level (e.g., 1 Watt) when VBAT 602 fluctuates as illustrated in the second operational cycle 612 and the third operational cycle.

In at least one embodiment, the need for a booster circuit (not shown) is significantly reduced. By compensating for drops in battery voltage in the manner described, a booster would be necessary only be utilized in severe cases.

Current sink and current demand of components can vary depending on whether the sensor is in the measurement mode of the idle mode. For example, during the idle mode, transmitter and the receiver components of the sensor 104 are not active. Since current from current source 422 (of receiver 404) is not needed to power analog block 428 and source 490 (of transmitter 408) is not needed to drive analog block 482, current consumption of the sensors can be reduced by opening switch 414 (of receiver 404) and opening switch 478 (of transmitter 408) by control circuit 498. Thus, the current sink from the bus 214 is dynamically adjusted based on the needs of the sensor. Dynamically adjusting the current delivered to sensor components enables the steady state voltage at the bus 214 to be adjusted based on the battery voltage. Dynamically adjusting the current delivered to sensor components enables a meaningful amount of current to be continuously drawn from the bus during the communications phase. Continuously sinking current from the bus enables current to be drawn from the tank capacitor in an even manner and avoids the need for frequent current spikes like 521 in FIG. 5. Because the master node 202 does not need to able to deliver such spikes in current, the master node 202 can be much smaller than would be required in conventional systems.

Figure 7:
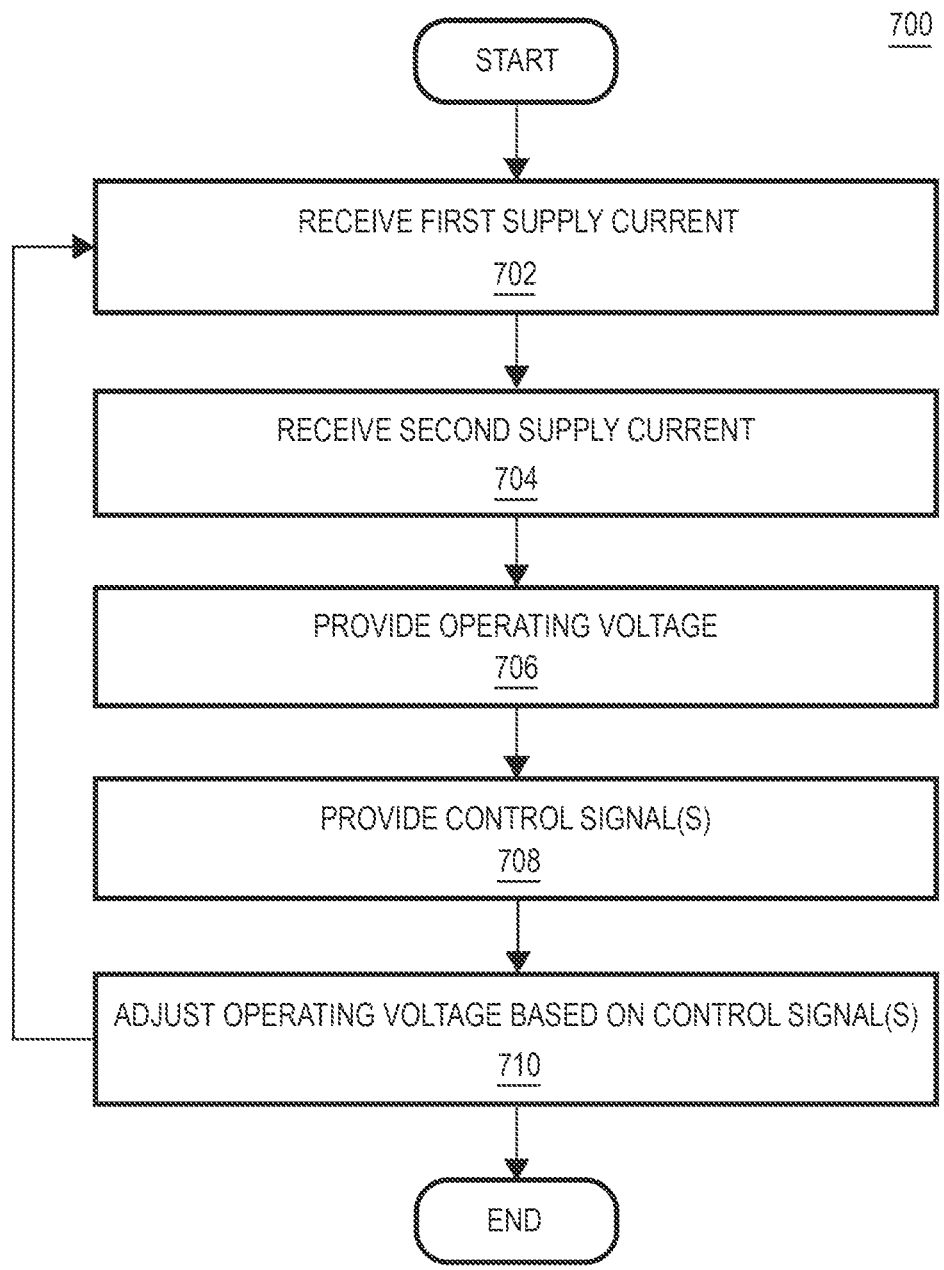
FIG. 7 illustrates a method of operating a sensor node, in accordance with an example of this disclosure.

FIG. 7 illustrates a method (700) of operating a sensor node 104 coupled to a communication interface bus. The method (700) includes: receiving (702) a first supply current (435) at a first terminal of a receiver circuit; receiving (704) a second supply current (437) at a first terminal of a supply circuit (406) wherein the supply circuit comprises a second terminal (468) coupled to a power supply terminal (ground), a control input (413), and an output; and providing (706) an operating voltage at the output of the supply circuit.

The method also includes providing (708) a first control signal (441) and a second control signal using a control circuit, the control circuit having an input coupled to the output of the supply circuit, and a second output (407) coupled to the control input (413) of the supply circuit (406) operable to provide a second control signal (443), wherein the first control signal (441) enables the receiver circuit (404) when the control circuit (498) is operating in a first mode and disables the receiver circuit (404) when the control circuit (498) is operating in a second mode; and adjusting (710) the operating voltage at the output of the supply circuit 406 in response to the second control signal (443).

In at least one embodiment, the method 700 further includes: using the second control signal to enable and disable a switch (446), the switch having a first terminal 444 coupled to the first terminal (434) of the supply circuit (406) and the output (439) of the supply circuit, a second terminal (458), and a control input 413 operable to receive the second control signal (443); and providing the operating voltage using the supply circuit (406) when the switch (446) is open in response to the second supply current (443) and when the switch (446) is closed in response to the second supply current (443). In at least one embodiment, the method 700 further includes: using the control circuit to provide a third control signal to a transmitter circuit, the transmitter circuit having a first input coupled to the output of the supply circuit, wherein, wherein the third control signal changes an operating mode of the transmitter circuit.

The technologies and methods of this disclosure have been described with reference to several example embodiments. However, changes and modifications may be made to the example embodiments without departing from the scope of the technologies and methods set forth. For example, while an example embodiment may describe a few examples of drone nodes, one of skill in the art will understand the system may be accomplished with other such drone nodes capable of performing similar functions. In addition, while specific details such as operating voltages have been provided to aid in understanding, one of skill in the art will understand that the technologies and methods of this disclosure are not limited to such specifications. These and other changes or modifications are intended to fall within the scope of this disclosure and the attached claims.

What is claimed is:

1. A sensor device coupled to a communication interface bus, the sensor device comprising:
   a current source operable to provide a supply current to an operating voltage node;
   a voltage clamp coupled between the operating voltage node and a power supply terminal; and
   a control circuit coupled to the voltage clamp to receive a current sense signal and coupled to the current source to provide an adjustment signal to adjust the supply current responsive to the current sense signal,
   wherein the current source is coupled to a tank capacitor to charge the tank capacitor using the supply current.

2. The sensor device of claim 1, wherein the current source is configured to charge the tank capacitor to a predetermined operating voltage.

3. The sensor device of claim 1, wherein the current source is operable to draw the supply current from the communication interface bus.

4. The sensor device of claim 3, wherein the current source is operable to receive the supply current through the communication interface bus from a master device.

5. The sensor device of claim 4, wherein the supply current corresponds to a first average current level during a power phase of the master device and corresponds to a second average current level during a communications phase of the master device, and wherein the first average current level is at least one hundred times greater than the second average current level.

6. The sensor device of claim 5, wherein the communication interface bus has a master device to sensor device data bandwidth of 50 kbit/second during the communications phase of the master device.

7. The sensor device of claim 5, wherein the communication interface bus has a sensor device to master device data bandwidth of 400 kbit/second during the communications phase of the master device.

8. The sensor device of claim 1, wherein the voltage clamp includes a Zener diode having a cathode connected to the current source and an anode connected to ground.

9. A sensor node coupled to a communication interface bus, the sensor node comprising:
   a receiver circuit operable to receive a first supply current and a first control signal;

a supply circuit operable to receive a second supply current and a second control signal, the supply circuit operable to provide an operating voltage at an output; and a control circuit operable to provide the first control signal to enable the receiver circuit when the control circuit is operating in a first mode and to disable the receiver circuit when the control circuit is operating in a second mode, and operable to provide the second control signal to the supply circuit to adjust a voltage at the output.

10. The sensor node of claim 9, wherein the supply circuit further comprises:

a capacitor coupled to a power supply terminal; and a switch responsive to the second control signal to couple the capacitor to the output and to decouple the capacitor from the output.

11. The sensor node of claim 10, further comprising:

a transmitter circuit powered by the operating voltage, wherein the control circuit is operable to provide a third control signal to change an operating mode of the transmitter circuit.

12. The sensor node of claim 11, wherein the first mode corresponds to a communications phase of a sensory network during which information corresponding to one or more signals detected using the receiver circuit are sent to a master node through the communication interface bus and during which the supply circuit receives current through the communication interface bus.

13. The sensor node of claim 12, wherein the supply circuit supplies operating voltage based, at least in part, on current received through the communication interface bus and during the communications phase of the sensory network.

14. The sensor node of claim 12, wherein the second mode corresponds to a power phase of the sensory network during which the transmitter circuit is driven in response to a current received through the communication interface bus and during which a second capacitor coupled to output is charged to the operating voltage by the current received through the communication interface bus.

15. A method of operating a sensor node coupled to a communication interface bus, the method comprising:

receiving a first supply current at a receiver circuit;

receiving a second supply current at a supply circuit;

providing an operating voltage at an output of the supply circuit;

providing a first control signal from a control circuit to enable the receive circuit when the control circuit is operating in a first mode and to disable the receiver circuit when the control circuit is operating in a second mode; and providing a second control signal from the control circuit to adjust the operating voltage at the output of the supply circuit.

16. The method of claim 15, further comprising:

using the second control signal to close and open a switch coupled between a capacitor and the output of the supply circuit.

17. The method of claim 16, further comprising:

using the control circuit to provide a third control signal to a transmitter circuit, the transmitter circuit being powered by the output of the supply circuit, wherein the third control signal changes an operating mode of the transmitter circuit.

\* \* \* \* \*